US012588154B2

(12) United States Patent
Sakamoto et al.

(10) Patent No.: US 12,588,154 B2
(45) Date of Patent: Mar. 24, 2026

(54) FOLDABLE DISPLAY

(71) Applicant: Sharp Display Technology Corporation, Kameyama City (JP)

(72) Inventors: Mayuko Sakamoto, Kameyama City (JP); Takehiro Murao, Kameyama City (JP); Yasuyuki Togashi, Kameyama City (JP); Ikuo Ninomiya, Kameyama City (JP); Ryoh Kikuchi, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 112 days.

(21) Appl. No.: 18/724,587

(22) PCT Filed: Feb. 28, 2022

(86) PCT No.: PCT/JP2022/008278
§ 371 (c)(1),
(2) Date: Jun. 26, 2024

(87) PCT Pub. No.: WO2023/162221
PCT Pub. Date: Aug. 31, 2023

(65) Prior Publication Data
US 2025/0071915 A1      Feb. 27, 2025

(51) Int. Cl.
*H05K 5/02* (2006.01)
*G06F 1/16* (2006.01)
(52) U.S. Cl.
CPC ............. *H05K 5/02* (2013.01); *G06F 1/1652* (2013.01)

(58) Field of Classification Search
CPC ......... H05K 5/02; G09F 9/301; G06F 1/1652; G06F 1/1681
See application file for complete search history.

(56) References Cited

U.S. PATENT DOCUMENTS

| | | | |
|---|---|---|---|
| 9,983,424 B2 | 5/2018 | Kim et al. | |
| 11,570,911 B2 * | 1/2023 | Shin ........................ | G06F 3/046 |
| 2019/0132987 A1 | 5/2019 | Koo et al. | |
| 2021/0201710 A1 * | 7/2021 | Kim ...................... | G06F 1/1626 |
| 2021/0341972 A1 | 11/2021 | Togashi | |
| 2021/0397218 A1 * | 12/2021 | Seo ........................ | G06F 1/1616 |
| 2022/0091689 A1 * | 3/2022 | Kishimoto ............ | G06F 1/1643 |
| 2022/0199921 A1 * | 6/2022 | Kim ...................... | G06F 1/1652 |

FOREIGN PATENT DOCUMENTS

| | | |
|---|---|---|
| WO | 2019/088372 A1 | 5/2019 |
| WO | 2020/065936 A1 | 4/2020 |

* cited by examiner

*Primary Examiner* — Sagar Shrestha
(74) *Attorney, Agent, or Firm* — ScienBiziP, P.C.

(57) ABSTRACT

A foldable display includes a housing unit including a hinge member, and a first housing and a second housing coupled via the hinge member, and a flexible display panel including a flexible display layer and a support substrate. The support substrate includes a third portion between a first portion and a second portion of the support substrate. The third portion of the support substrate includes, in a first state, a first region overlapping a at least one step portion and a second region overlapping a planar portion. A first ratio of volume of openings of an opening group in the first region to volume of the first region in the first region of the support substrate is lower than a second ratio of volume of openings of an opening group in the second region to volume of the second region in the second region of the support substrate.

20 Claims, 14 Drawing Sheets

| | | Example | | | | Arrangement example of applicable openings 3d | |
| --- | --- | --- | --- | --- | --- | --- | --- |
| | | Arrangement example 1 of openings 3d | Arrangement example 2 of openings 3d | Number of pixels included in opening 3d | | | Number of pixels included in opening 3d (pixel size 40 μm to 400 μm) |
| | | Distance [μm] | | S-stripe matrix (pixel size 100 μm) | Diamond pentile matrix (pixel size 60 μm) | Distance [μm] | |
| Y direction | WA | 90 | 195 | - | - | 50 to 500 | - |
| | WB | 225 | 221 | 2 | 3 | 100 to 400 | 1 to 10 |
| X direction | WC | 150 | 154 | - | - | 100 to 300 | - |
| | WD | 2220 | 2221 | 22 | 37 | 1000 to 4000 | 2 to 100 |
| Material occupancy rate of support substrate | | Approximately 35% | Approximately 50% | | | - | Total 2 to 1000 |

FIG. 5

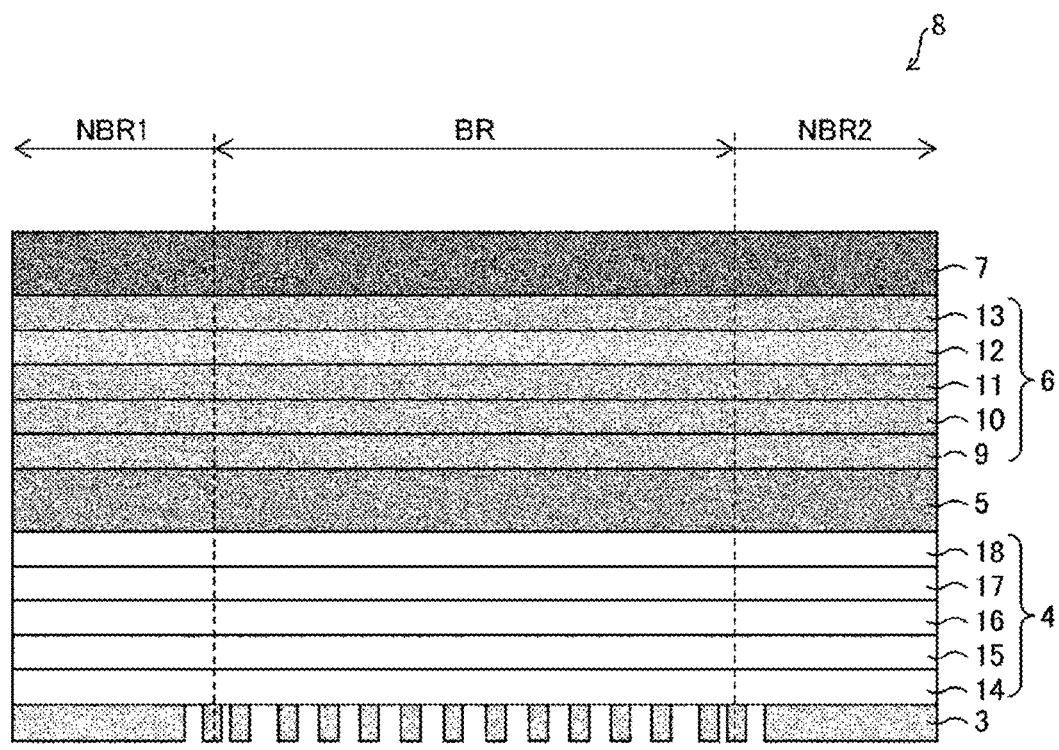
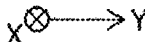
FIG. 6

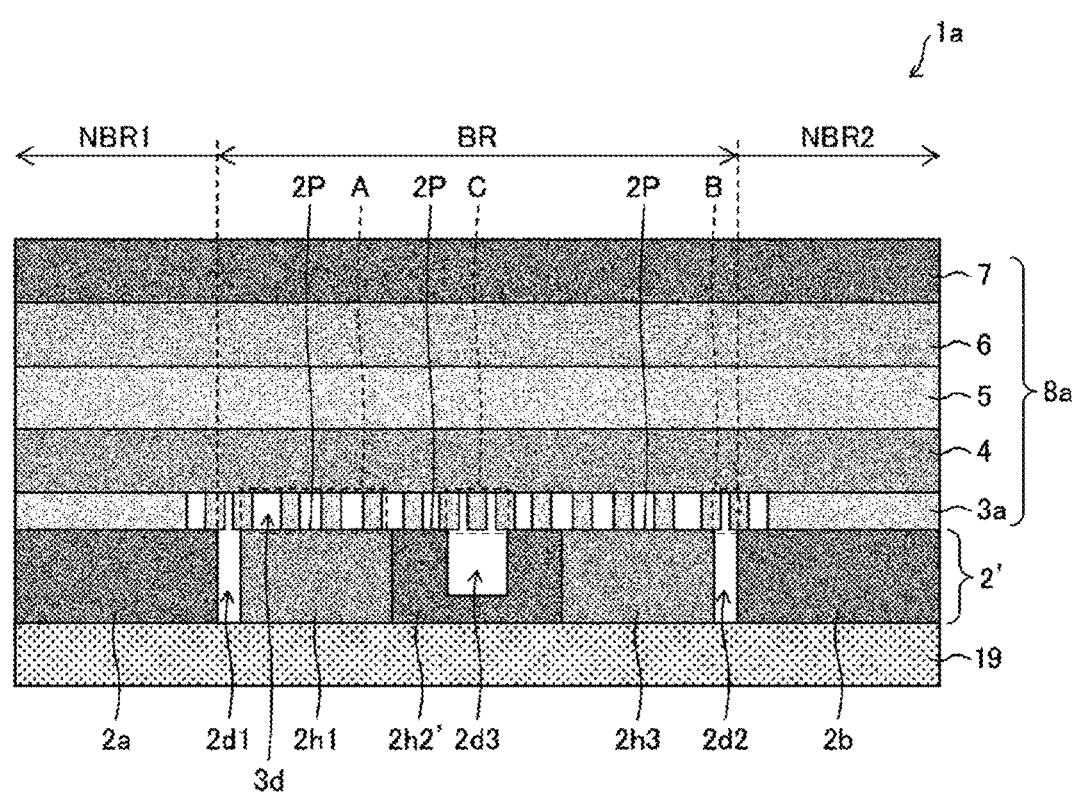
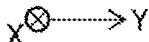
FIG. 7

| Evaluation content | Evaluation position | 30 to 35% | 40 to 50% | 50 to 65% | 70% or more |
|---|---|---|---|---|---|
| | | | Material occupancy rate of support substrate | | |
| Ball drop 24 g Φ 18 mm | Step portion (2d1, 2d2, 2d3) | 10 cm | 15 cm | 15 cm | 15 cm |
| | Edge of step portion | 10 cm | 15 cm | 15 cm | 20 cm (*) |
| | Planar portion of 2h2' | 20 cm (*) | - | 20 cm (*) | - |
| | Planar portion of 2h1, 2h2, 2h3 | 35 cm (*) | - | 35 cm (*) | - |
| | Non-bent portion (2a, 2b) | 75 cm (*) | - | 75 cm (*) | - |
| Pen drop 19 g Pen tip made of elastomer | Step portion (2d1, 2d2, 2d3) | 3 cm | 5 cm | 8 cm | 12 cm |
| | Edge of step portion | 8 cm | 10 cm | 18 cm (*) | 18 cm (*) |
| | Planar portion of 2h2' | 18 cm (*) | - | 18 cm (*) | - |
| | Planar portion of 2h1, 2h2, 2h3 | 30 cm (*) | - | 30 cm (*) | - |
| | Non-bent portion (2a, 2b) | 45 cm (*) | - | 45 cm (*) | - |
| Pen tracing Step feeling | Step portion (2d1, 2d2, 2d3) | Large | Small | Almost none | Almost none |

FIG. 9

| Evaluation content | Evaluation temperature | When first film layer 15 of cushion layer 4 is metal film | When first film layer 15 of cushion layer 4 is plastic film |
|---|---|---|---|
| Bending test | High temperature 60°C | - | 1000 times - OK (*) |
| | High temperature 40°C | To 3000 times - NG | 30000 times - OK (*) |
| | Room temperature 25°C | To 8000 times - NG | 45000 times - OK (*) |
| | Low temperature 0°C | To 16000 times - NG | 30000 times - OK (*) |
| | Low temperature -20°C | - | 1000 times - OK (*) |

FIG. 10

| Material occupancy rate of support substrate | | When first adhesive layer 14 of cushion layer 4 is hard adhesive | | When first adhesive layer 14 of cushion layer 4 is soft adhesive | |
|---|---|---|---|---|---|
| Evaluation content | Evaluation position | 30 to 35% | 50 to 65% | 30 to 35% | 50 to 65% |
| Pen drop 19 g | Step portion (2d1, 2d2, 2d3) | 3 cm | 8 cm | 1 cm | 6 cm |
| | Edge of step portion | 8 cm | 18 cm (*) | 5 cm | 10 cm |
| | Planar portion of 2h2' | 18 cm (*) | 18 cm (*) | 18 cm (*) | 18 cm (*) |
| | Planar portion of 2h1, 2h2, 2h3 | 30 cm (*) | 30 cm (*) | - | - |
| Pen tip made of elastomer | Non-bent portion (2a, 2b) | 45 cm (*) | 45 cm (*) | 45 cm (*) | 45 cm (*) |

FIG. 11

FOLDABLE DISPLAY

TECHNICAL FIELD

The disclosure relates to a foldable display.

BACKGROUND ART

In the field of foldable displays, there is a problem of unsatisfactory flexibility, and research is being actively conducted to improve the flexibility.

For example, PTL 1 describes a configuration of a foldable display with openings in a back plate included in the foldable display in order to maintain a shape of the foldable display and prevent the foldable display from being sagged or deformed when the display is repeatedly bent (folded) and unbent (opened).

PTL 2 describes, in order to improve flexibility, a configuration in which multiple openings are provided in a bending center portion having a large curvature so that a large proportion is occupied by the openings in a flexible frame included in the foldable display, and multiple openings are provided in a portion having a small curvature so that a smaller proportion is occupied by the openings in the flexible frame included in the foldable display when a foldable display is bent (folded).

CITATION LIST

Patent Literature

PTL 1: U.S. Pat. No. 9,983,424 B2
PTL 2: WO 2019/088372 A1

SUMMARY

Technical Problem

In each of the foldable displays described in PTLs 1 and 2, the openings are provided in the back plate or the flexible frame included in the foldable display from the viewpoint of improving flexibility without considering that a step portion is formed in a housing unit including a hinge member that is commonly included in the foldable display. Therefore, each of the foldable displays described in PTLs 1 and 2 is configured to be greatly affected by the step portion formed in the housing unit including the hinge member. Thus, it is not possible to ensure satisfactory impact resistance of the foldable display. Alternatively, when the impact resistance is attempted to be ensured, the flexibility deteriorates. Thus, the impact resistance and the flexibility may not be ensured at the same time.

In the foldable display described in PTL 1, it is disclosed that an additional layer made of an inorganic material is provided as a back plate, in addition to the plate having the openings, in order to protect the bent portion or prevent sagging or deformation of the bent portion. However, this additional layer made of an inorganic material deteriorates the flexibility, so a foldable display having a large curvature or a foldable display having two types of curvatures cannot ensure satisfactory flexibility.

In the foldable display described in PTL 2, a configuration is described in which a silicone layer is provided to fill the openings in the support substrate. However, when the silicone layer is provided in this manner, it is difficult to ensure satisfactory flexibility, and appearance of the display is likely to be very poor due to uneven silicone coating or the like that occurs during a manufacturing process.

One aspect of the disclosure has been made in view of the above-described problems, and an object thereof is to provide a foldable display having excellent flexibility while improving impact resistance compared to fordable displays in the related art.

Solution to Problem

In order to achieve the above object, a foldable display according to the disclosure includes a housing unit including a hinge member, and a first housing and a second housing coupled via the hinge member, and a flexible display panel including a flexible display layer and a support substrate, in which the support substrate is provided between the flexible display layer and the housing unit, by fixing a first portion of the support substrate to the first housing and fixing a second portion of the support substrate to the second housing, the flexible display panel is fixed to the housing unit, in a first state in which a surface of the first housing on a support substrate side and a surface of the second housing on the support substrate side are aligned on the same plane and the flexible display panel is in a non-bent state, the housing unit includes a planar portion being flat with respect to the same plane and at least one step portion including a step with respect to the same plane, the support substrate includes a third portion between the first portion and the second portion of the support substrate, the third portion of the support substrate includes, in the first state, a first region overlapping the at least one step portion and a second region overlapping the planar portion, and a first ratio of volume of openings of an opening group in the first region to volume of the first region in the first region of the support substrate is lower than a second ratio of volume of openings of an opening group in the second region to volume of the second region in the second region of the support substrate.

Advantageous Effects of Disclosure

According to the one aspect of the disclosure, it is possible to provide a foldable display having excellent flexibility while improving impact resistance compared to fordable displays in the related art.

BRIEF DESCRIPTION OF DRAWINGS

FIG. 5 is a diagram for explaining a relationship between the size of one opening in the opening pattern provided as one example in the support substrate included in the foldable display according to the first embodiment and the size of the pixel included as one example in the foldable display according to the first embodiment.

FIG. 6 is a diagram illustrating a schematic configuration of a flexible display panel included in the foldable display according to the first embodiment.

FIG. 7 is a cross-sectional view illustrating a schematic configuration of a foldable display according to a modification of the first embodiment in a non-bent state (open state).

FIG. 9 is a diagram showing evaluation results of impact resistance of the foldable display according to the first embodiment and the foldable display according to the modification of the first embodiment.

FIG. 10 is a diagram showing evaluation results of a bending test comparing a case in which a first film layer is a plastic film and a case in which the first film layer is a metal film, where the first film layer is in a cushion layer included in the foldable display according to the first embodiment and the foldable display according to the modification of the first embodiment.

FIG. 11 is a diagram showing evaluation results of impact resistance comparing a case in which a first adhesive layer is a hard adhesive and a case in which the first adhesive layer is a soft adhesive, where the first adhesive layer is in the cushion layer included in the foldable display according to the first embodiment and the foldable display according to the modification of the first embodiment.

DESCRIPTION OF EMBODIMENTS

Embodiments of the disclosure will be described below with reference to FIGS. 1 to 14. Hereinafter, for convenience of description, configurations having the same functions as those described in a specific embodiment are denoted by the same reference signs, and descriptions thereof will be omitted.

First Embodiment

Figure 1:
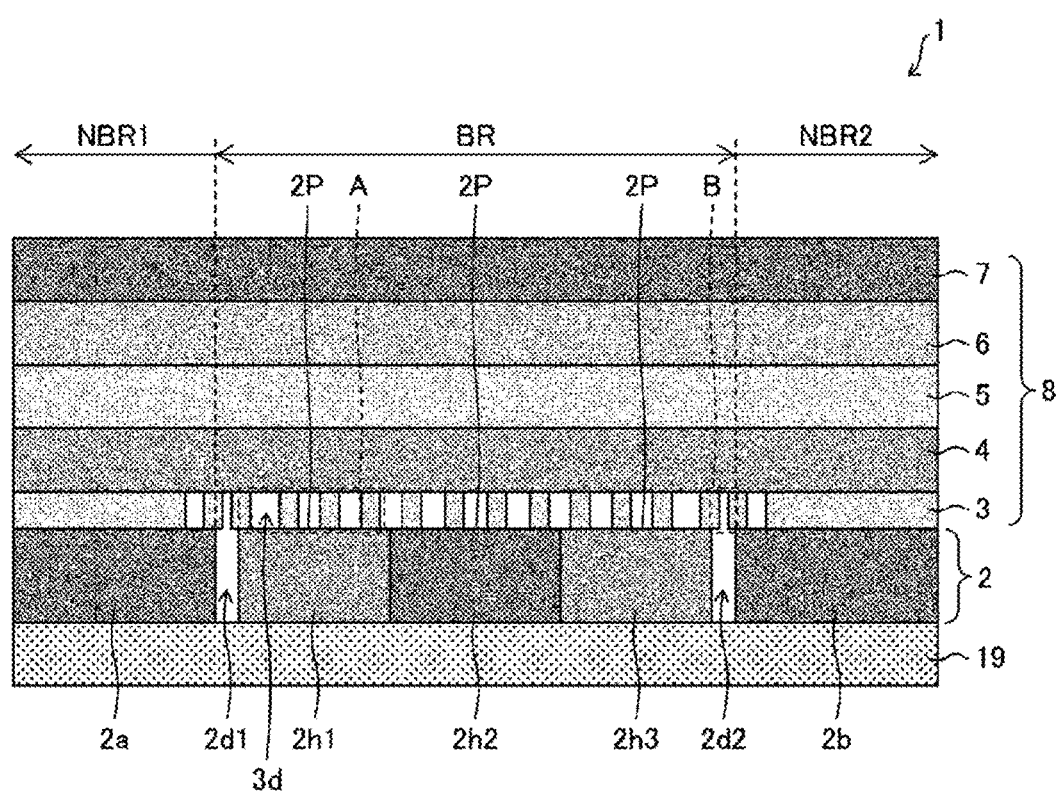
FIG. 1 is a cross-sectional view illustrating a schematic configuration of a foldable display according to a first embodiment in a non-bent state (open state).

FIG. 1 is a cross-sectional view illustrating a schematic configuration of a foldable display 1 according to a first embodiment in a non-bent state (open state).

As illustrated in FIG. 1, the foldable display 1 includes a housing unit 2 including hinge members 2h1, 2h2, and 2h3, and a first housing 2a and a second housing 2b coupled to each other via the hinge members 2h1, 2h2, and 2h3, and a flexible display panel 8 including a support substrate 3 and a flexible display layer 5. Although not illustrated, the first housing 2a and the second housing 2b are coupled to each other via the hinge members 2h1, 2h2, and 2h3 in an X direction X, which is a depth direction in FIG. 1 orthogonal to a Y direction Y, which is a horizontal direction in FIG. 1.

In the present embodiment, as illustrated in FIG. 1, a case will be described in which the foldable display 1 further includes a cushion layer 4 to be described later between the support substrate 3 and the flexible display layer 5, includes a function layer 6 and a flexible cover 7 to be described later as upper layers of the flexible display layer 5, and includes a housing cover 19 as a lower layer of the housing unit 2. However, the configuration of the foldable display 1 is not limited thereto. That is, in the present embodiment, the case in which the flexible display panel 8 includes the support substrate 3, the cushion layer 4, the flexible display layer 5, the function layer 6, and the flexible cover 7 will be described as an example, but the configuration of the flexible display panel 8 is not limited thereto. The flexible display panel 8 only needs to include the support substrate 3 and the flexible display layer 5. The foldable display 1 does not need to include the housing cover 19.

The support substrate 3 is provided between the housing unit 2 and the flexible display layer 5. A region NBR1 including one end portion of the support substrate 3 as an example of a first portion of the support substrate 3 is fixed to the first housing 2a, a region NBR2 including another end portion of the support substrate 3 as an example of a second portion of the support substrate 3 is fixed to the second housing 2b, whereby the flexible display panel 8 is fixed to the housing unit 2. When fixing the region NBR1 including the one end portion of the support substrate 3 to the first housing 2a and fixing the region NBR2 including the other end portion of the support substrate 3 to the second housing 2b, for example, an adhesive may be used or screws may be used.

A portion including the region NBR1 including the one end portion of the support substrate 3 and the region NBR2 including the other end portion of the support substrate 3 is a non-bending region of the flexible display panel 8, and a portion including a third portion BR of the support substrate 3 between the region NBR1 including the one end portion of the support substrate 3 and the region NBR2 including the other end portion of the support substrate 3 is a bending region of the flexible display panel 8.

As illustrated in FIG. 1, in a first state in which a surface of the first housing 2a on a support substrate 3 side and a surface of the second housing 2b on the support substrate 3 side are aligned on the same plane and the flexible display panel 8 is in a non-bent state, the housing unit 2 includes a planar portion 2P that is flat with respect to the same plane and one or more step portions 2d1 and 2d2 that have a step with respect to the same plane. In the present embodiment, a case in which the housing unit 2 has two types of step portions 2d1 and 2d2 will be described as an example, but the step portions are not limited thereto. For example, the housing unit may have three or more types of step portions as in a modification of the present embodiment described later, or the housing unit may have one type of step portion as in a third embodiment to be described later.

In the first state described above, the third portion BR of the support substrate 3 includes a first region that overlaps the step portions 2d1 and 2d2 (e.g., including a region B indicated by a dotted line in FIG. 1) and a second region that overlaps the planar portion 2P (e.g., including a region A indicated by a dotted line in FIG. 1). That is, the first region of the third portion BR of the support substrate 3 is a region obtained by combining a region of the third portion BR of the support substrate 3 overlapping the step portion 2d1 and a region of the third portion BR of the support substrate 3 overlapping the step portion 2*d*2, and the second region of the third portion BR of the support substrate 3 is a region of the third portion BR of the support substrate 3 overlapping the planar portion 2P.

As illustrated in FIG. 1, a first ratio of volume of openings 3*d* of an opening group in the first region to volume of the first region in the first region of the support substrate 3 is lower than a second ratio of volume of openings 3*d* of an opening group in the second region to volume of the second region in the second region of the support substrate 3.

As illustrated in FIG. 1, the planar portion 2P is formed by the hinge members 2*h*1, 2*h*2, and 2*h*3. The step portion 2*d*1 includes a gap between the first housing 2*a* and the hinge member 2*h*1, and the step portion 2*d*2 includes a gap between the second housing 2*b* and the hinge member 2*h*3.

Figure 2:
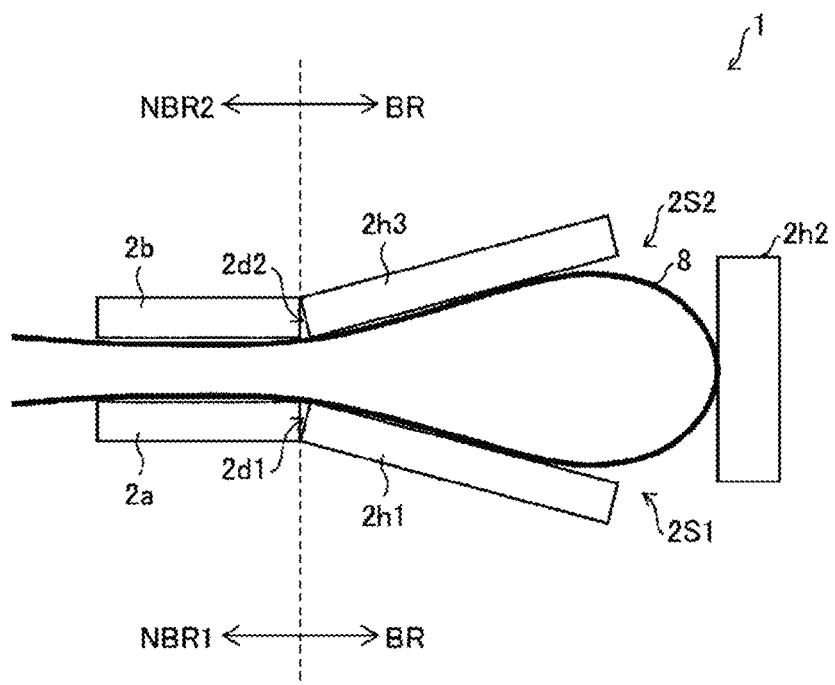
FIG. 2 is a diagram illustrating the foldable display according to the first embodiment in a bent state (folded state).

FIG. 2 is a diagram illustrating the foldable display 1 according to the first embodiment in a bent state (folded state).

As illustrated in FIG. 2, in the folded state of the foldable display 1 with the surface of the first housing 2*a* on the support substrate 3 side and the surface of the second housing 2*b* on the support substrate 3 side placed to face each other and a distance between the first housing 2*a* and the second housing 2*b* being reduced, that is, in a second state in which the flexible display panel 8 is in the bent state, the flexible display panel 8 has a droplet shape.

Note that as illustrated in FIG. 2, in the state in which the foldable display 1 is folded, a gap 2S1 is generated between the hinge member 2*h*1 and the hinge member 2*h*2, and a gap 2S2 is generated between the hinge member 2*h*2 and the hinge member 2*h*3.

Figure 3:
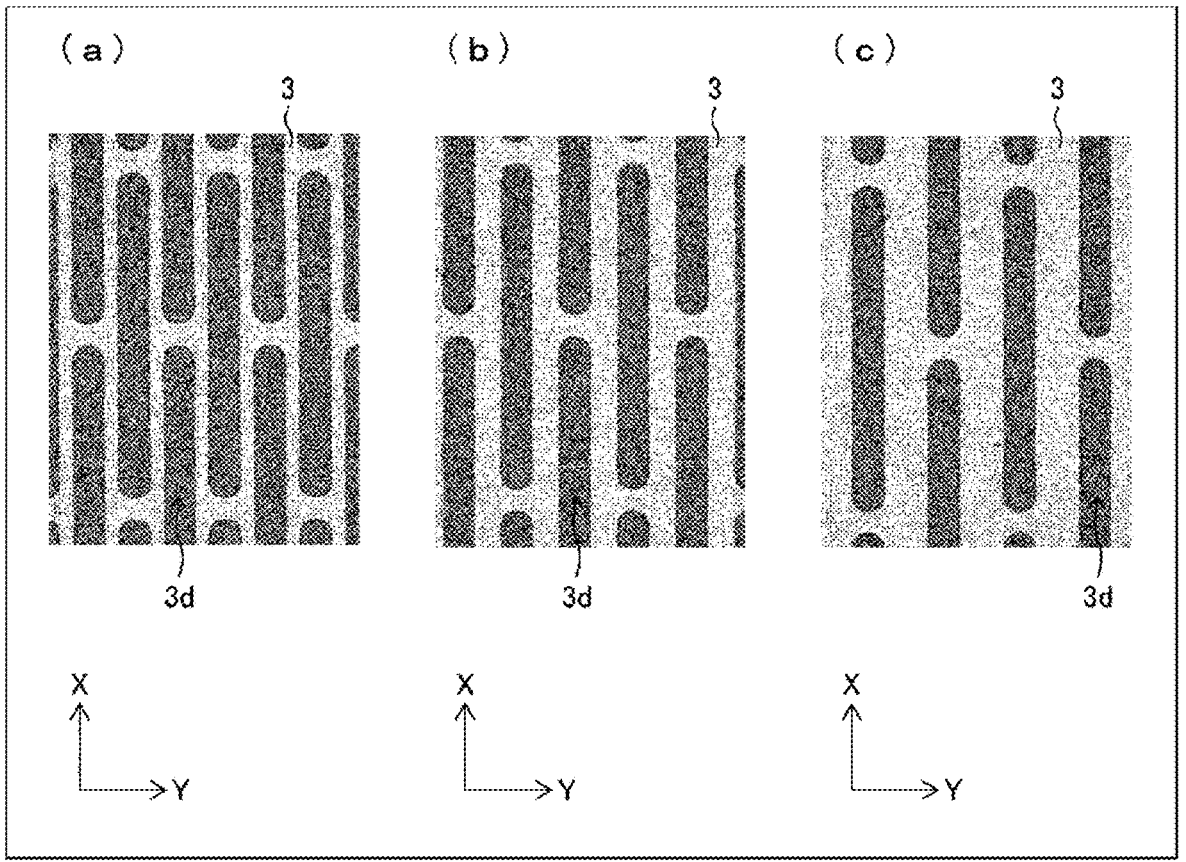
FIGS. 3($a$), ($b$), and ($c$) are diagrams illustrating examples of opening patterns provided in a support substrate included in the foldable display according to the first embodiment.

(a), (b), and, (c) of FIG. 3 are diagrams illustrating examples of opening patterns provided in the support substrate 3 included in the foldable display 1 according to the first embodiment.

The opening pattern provided in the support substrate 3 illustrated in (a) of FIG. 3 is an example of a case in which a ratio of volume of the openings 3*d* of the opening group in a corresponding region to volume of the corresponding region is approximately 65%, that is, a ratio of volume of a material of the support substrate 3 in the corresponding region to the volume of the corresponding region is approximately 35%.

The opening pattern provided in the support substrate 3 illustrated in (b) of FIG. 3 is an example of a case in which a ratio of volume of the openings 3*d* of the opening group in a corresponding region to volume of the corresponding region is approximately 50%, that is, a ratio of volume of a material of the support substrate 3 in the corresponding region to the volume of the corresponding region is approximately 50%.

The opening pattern provided in the support substrate 3 illustrated in (c) of FIG. 3 is an example of a case in which a ratio of volume of the openings 3*d* of the opening group in a corresponding region to volume of the corresponding region is approximately 40%, that is, a ratio of volume of a material of the support substrate 3 in the corresponding region to the volume of the corresponding region is approximately 60%.

Note that a Y direction Y illustrated in (a), (b), and (c) of FIG. 3 is the same as the Y direction Y illustrated in FIG. 1, and an X direction X illustrated in (a), (b), and (c) of FIG. 3 is the same as the X direction X illustrated in FIG. 1.

Note that in the present embodiment, as illustrated in (a), (b), and (c) of FIG. 3, a case is described as an example in which the openings 3*d* in the opening pattern provided in the support substrate 3 are formed in a rectangular shape in which a length in the X direction is longer than a length in the Y direction, but a shape of the openings 3*d* in the opening pattern provided in the support substrate 3 are not limited to any particular shape. For example, the shape of the openings 3*d* may be circular, hexagonal, rhombic, or Y-shaped.

In the present embodiment, a case in which each of the openings 3*d* of the opening group provided in the support substrate 3 is an opening passing through from a surface of the support substrate 3 on a flexible display layer 5 side to a surface of the support substrate 3 on a housing unit 2 side will be described as an example, but the openings 3*d* are not limited to passing through the support substrate 3. For example, among the openings 3*d* of the opening group provided in the support substrate 3, only some of the openings 3*d* may be openings that pass through from the surface of the support substrate 3 on the flexible display layer 5 side to the surface of the support substrate 3 on the housing unit 2 side, and the remaining openings 3*d* may be openings that do not pass through from the surface of the support substrate 3 on the flexible display layer 5 side to the surface of the support substrate 3 on the housing unit 2 side. Alternatively, all the openings 3*d* of the opening group provided in the support substrate 3 may be openings that do not pass through from the surface of the support substrate 3 on the flexible display layer 5 side to the surface of the support substrate 3 on the housing unit 2 side.

In the present embodiment, a case in which the support substrate 3 is a metal substrate formed with a thickness of 150 μm will be described as an example, but the support substrate 3 is not limited thereto, and the support substrate 3 may be a resin substrate.

As a material of the metal substrate, for example, a material including at least one of stainless steel, aluminum, titanium, and copper can be used.

As a material of the resin substrate, for example, a polyester resin, an acrylic resin, polycarbonate, and a carbon fiber reinforced plastic can be used.

Note that a thickness of the support substrate 3 is preferably from 100 μm to 300 μm in consideration of ease of manufacturing the support substrate 3 and ensuring flexibility of the support substrate 3.

Note that when the support substrate 3 is a resin substrate, the opening group, that is, the multiple openings 3*d*, can be formed in the support substrate 3 by, for example, punching or die cutting. On the other hand, when the support substrate 3 is a metal substrate, the opening group, that is, the multiple openings 3*d*, can be formed in the support substrate 3 by, for example, exposure and development using a mask pattern followed by an etching process.

In the third portion BR of the support substrate 3, in the first state described above, the first ratio of the volume of the openings 3*d* of the opening group in the first region to the volume of the first region in the first region overlapping the step portions 2*d*1 and 2*d*2 is preferably 60% or less in terms of ensuring the impact resistance of the foldable display 1. On the other hand, in the third portion BR of the support substrate 3, in the first state described above, the second ratio of the volume of the openings 3*d* of the opening group in the second region to the volume of the second region in the second region overlapping the planar portion 2P is preferably from 55% to 75% as long as the second ratio is larger than the first ratio in terms of ensuring the flexibility of the foldable display 1.

Therefore, in the first region overlapping the step portions 2*d*1 and 2*d*2 in the third portion BR of the support substrate 3, for example, the opening pattern provided in the support substrate 3 illustrated in (b) of FIG. 3 or the opening pattern provided in the support substrate 3 illustrated in (c) of FIG. 3 can be suitably used, and in the second region overlapping the planar portion 2P in the third portion BR of the support substrate 3, the opening pattern provided in the support substrate 3 illustrated in (a) of FIG. 3 can be suitably used.

Figure 4:
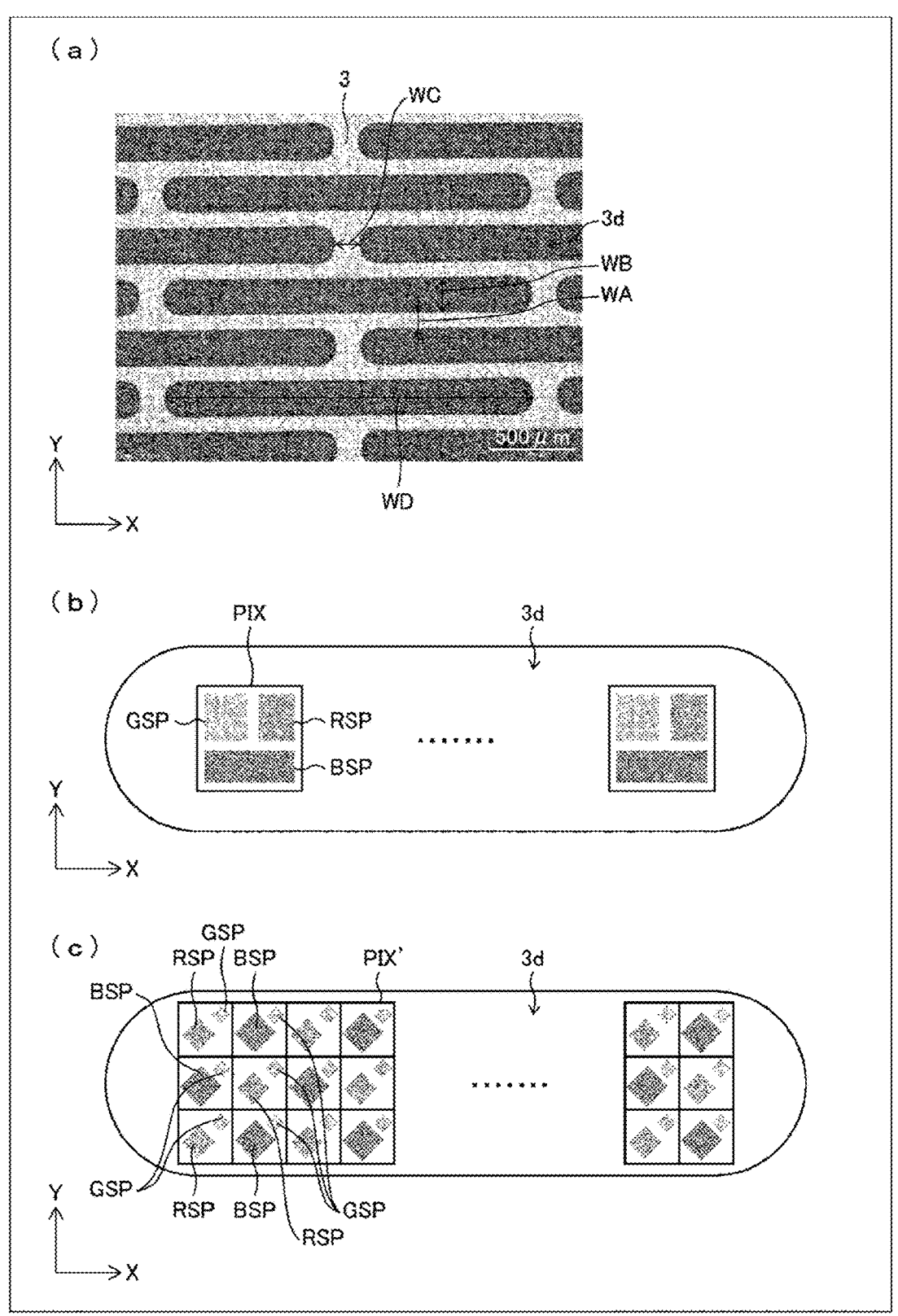
FIG. 4($a$) is a diagram illustrating dimensions of an opening and pitches of openings in an opening pattern as one example provided in the support substrate included in the foldable display according to the first embodiment, and FIGS. 4($b$) and ($c$) are diagrams comparing size of the opening in one example of the opening pattern provided in the support substrate included in the foldable display according to the first embodiment and size of a pixel as one example included in the foldable display according to the first embodiment.

(a) of FIG. 4 is a diagram illustrating dimensions of the opening 3d and pitches between the openings 3d in one example of the opening pattern provided in the support substrate 3 included in the foldable display 1 according to the first embodiment.

(a) of FIG. 4 illustrates a line width WA of the support substrate material between the opening 3d and the opening 3d in the Y direction Y, a width WB of the opening 3d in the Y direction Y, a line width WC of the support substrate material between the opening 3d and the opening 3d in the X direction X, and a width WD of the opening 3d in the X direction X.

In the present embodiment, a case is described as an example in which the support substrate 3 is provided with an opening pattern including multiple openings 3d having the same shape in which the width WD of the opening 3d in the X direction X is larger than the width WB of the opening 3d in the Y direction Y, and the line width WC of the support substrate material between the opening 3d and the opening 3d in the X direction X is larger than the line width WA of the support substrate material between the opening 3d and the opening 3d in the Y direction Y. However, the opening pattern is not limited thereto. As described above, as long as the first ratio of the volume of the openings 3d of the opening group in the first region to the volume of the first region in the first region of the support substrate 3 is lower than the second ratio of the volume of the openings 3d of the opening group in the second region to the volume of the second region in the second region of the support substrate 3, for example, in the opening pattern provided in the support substrate 3, the shapes of the openings need not be the same, a relationship between the line width WA of the support substrate material between the opening 3d and the opening 3d in the Y direction Y and the line width WC of the support substrate material between the opening 3d and the opening 3d in the X direction X can be determined as appropriate, and a relationship between the width WB of the opening in the Y direction Y and the width WD of the opening in the X direction X can be determined as appropriate.

(b) of FIG. 4 is a diagram for comparing size of the opening 3d in one example of the opening pattern provided in the support substrate 3 included in the foldable display 1 according to the first embodiment with size of a pixel PIX in a case in which multiple subpixels are arranged in S-stripe, which is an example of a pixel included in the foldable display 1 according to the first embodiment.

As illustrated in (b) of FIG. 4, on one opening 3d of the opening group provided in the support substrate 3, multiple pixels PIX, which are included in the flexible display layer 5 and have a red subpixel RSP, a green subpixel GSP, and a blue subpixel BSP arranged in S-stripe, are placed.

(c) of FIG. 4 is a diagram for comparing size of the opening 3d in one example of the opening pattern provided in the support substrate 3 included in the foldable display 1 according to the first embodiment with size of a pixel PIX' in a case in which multiple subpixels are arranged in a diamond pentile structure, which is an example of a pixel provided in the foldable display 1 according to the first embodiment.

As illustrated in (c) of FIG. 4, on one opening 3d of the opening group provided in the support substrate 3, multiple pixels PIX', which are included in the flexible display layer 5 and have a green subpixel GSP and a red subpixel RSP or a blue subpixel BSP arranged in a diamond pentile structure, are placed.

FIG. 5 is a diagram for explaining a relationship between the size of one opening 3d in the opening pattern provided as one example in the support substrate 3 included in the foldable display 1 according to the first embodiment and the size of the pixels PIX and PIX' included as examples in the foldable display 1 according to the first embodiment.

In an arrangement example 1 of the openings 3d shown in FIG. 5, that is, an arrangement example 1 of the opening group including the openings 3d, the line width WA of the support substrate material between the opening 3d and the opening 3d in the Y direction Y is 90 μm, the width WB of the opening 3d in the Y direction Y is 225 μm, the line width WC of the support substrate material between the opening 3d and the opening 3d in the X direction X is 150 μm, and the width WD of the opening 3d in the X direction X is 2220 μm. In this case, the ratio of the volume of the openings 3d of the opening group in the corresponding region to the volume of the corresponding region is approximately 65%, that is, the ratio of the volume of the material of the support substrate 3 in the corresponding region to the volume of the corresponding region (a material occupancy rate of the support substrate 3) is approximately 35%. The arrangement example 1 is an opening pattern provided in the support substrate 3 illustrated in (a) of FIG. 3 that can be suitably used in the second region overlapping the planar portion 2P in the third portion BR of the support substrate 3.

In an arrangement example 2 of the openings 3d shown in FIG. 5, that is, an arrangement example 2 of the opening group including the openings 3d, the line width WA of the support substrate material between the opening 3d and the opening 3d in the Y direction Y is 195 μm, the width WB of the opening 3d in the Y direction Y is 221 μm, the line width WC of the support substrate material between the opening 3d and the opening 3d in the X direction X is 154 μm, and the width WD of the opening 3d in the X direction X is 2221 μm. In this case, the ratio of the volume of the openings 3d of the opening group in the corresponding region to the volume of the corresponding region is approximately 50%, that is, the ratio of the volume of the material of the support substrate 3 in the corresponding region to the volume of the corresponding region (a material occupancy rate of the support substrate 3) is approximately 50%. The arrangement example 2 can be suitably used in the first region overlapping the step portions 2d1 and 2d2 in the third portion BR of the support substrate 3.

In either case of the arrangement example 1 and the arrangement example 2 of the openings 3d shown in FIG. 5, when the size of one pixel PIX in which the multiple subpixels are arranged in S-stripe is 100 μm×100 μm, 2 pixels PIX can be arranged in the opening 3d in the Y direction Y and 22 pixels PIX can be arranged in the opening 3d in the X direction X, so that on one opening 3d of the opening group provided in the support substrate 3, 44 pixels PIX are provided in the flexible display layer 5, in which the red subpixel RSP, the green subpixel GSP, and the blue subpixel BSP are arranged in S-stripe.

In either case of the arrangement example 1 and the arrangement example 2 of the openings 3d shown in FIG. 5, when the size of one pixel PIX' in which the multiple subpixels are arranged in a diamond pentile matrix is 60 μm×60 μm, 3 pixels PIX' can be arranged in the opening 3d in the Y direction Y and 37 pixels PIX' can be arranged in the opening 3d in the X direction X, so that on one opening 3$d$ of the opening group provided in the support substrate 3, 111 pixels PIX' are provided in the flexible display layer 5, in which the green subpixel GSP and the red subpixel RSP or the blue subpixel BSP are arranged in a diamond pentile structure.

The arrangement of the openings 3$d$ is not limited to the arrangement example 1 and the arrangement example 2 of the openings 3$d$ described above. For example, as an arrangement example of applicable openings 3$d$ shown in FIG. 5, the line width WA of the support substrate material between the opening 3$d$ and the opening 3$d$ in the Y direction Y may be from 50 μm to 500 μm, the width WB of the opening 3$d$ in the Y direction Y may be from 100 μm to 400 μm, the line width WC of the support substrate material between the opening 3$d$ and the opening 3$d$ in the X direction X may be from 100 μm to 300 μm, and the width WD of the opening 3$d$ in the X direction X may be from 1000 μm to 4000 μm.

In the arrangement example of the applicable openings 3$d$ shown in FIG. 5, when the size of the pixel is 40 or more μm×40 μm or more and 400 μm or less x 400 μm or less, 1 or more and 10 or less pixels can be arranged in the opening 3$d$ in the Y direction Y, 2 or more and 100 or less pixels can be arranged in the opening 3$d$ in the X direction X, so that on one opening 3$d$ of the opening group provided in the support substrate 3, 2 or more and 1000 or less pixels included in the flexible display layer 5 are arranged.

FIG. 6 is a diagram illustrating a schematic configuration of the flexible display panel 8 included in the foldable display 1 according to the first embodiment.

As illustrated in FIG. 6, in the present embodiment, the flexible display panel 8 includes the support substrate 3, the cushion layer 4, the flexible display layer 5, the function layer 6, and the flexible cover 7.

In the present embodiment, a case will be described as an example in which the cushion layer 4 provided between the support substrate 3 and the flexible display layer 5 includes a first adhesive layer 14, a first film layer 15, a second adhesive layer 16, a second film layer 17, and a third adhesive layer 18 in this order from the support substrate 3 side, but the configuration of the cushion layer 4 is not limited thereto. For example, the cushion layer 4 preferably includes one or more resin layers, but is not limited thereto, and may include a layer made of a metal material.

At least one of the first film layer 15 and the second film layer 17 is preferably made of, for example, PET, PEN, a polyimide resin, an acrylic resin, or the like. In the present embodiment, each of the first film layer 15 and the second film layer 17 is made of PET, but the material is not limited thereto.

An elastic modulus of the first film layer 15 and an elastic modulus of the second film layer 17 are preferably from 1 GPa to 8 GPa, and more preferably from 3 GPa to 6 GPa.

In the present embodiment, the elastic modulus of the first film layer 15 is higher than the elastic modulus of the second film layer 17.

The first adhesive layer 14 is preferably formed with a thickness of 15 μm to 75 μm. The first film layer 15 is preferably formed with a thickness of 20 μm to 100 μm, and more preferably formed with a thickness of 25 μm to 75 μm. The second adhesive layer 16 is preferably formed with a thickness of 15 μm to 100 μm. The second film layer 17 is preferably formed with a thickness of 20 μm to 100 μm. The third adhesive layer 18 is preferably formed with a thickness of 15 μm to 75 μm.

Note that the first adhesive layer 14, the second adhesive layer 16, and the third adhesive layer 18 may be formed using any type of adhesive. For example, a hard adhesive (relatively hard adhesive) may be used in which a shear storage modulus at 25° C. is from $5.0 \times 10^4$ Pa to $1.0 \times 10^6$ Pa and a compressive stress measured at a test speed of 0.5 mm/min and a 40% compressive strain is from 500 kPa to 1200 kPa, or a soft adhesive (relatively soft adhesive) may be used in which a shear storage modulus at 25° C. is from $2.0 \times 10^4$ Pa to $5.0 \times 10^4$ Pa and a compressive stress measured at a test speed of 0.5 mm/min and a compressive strain of 40% is from 80 kPa to 300 kPa.

In the present embodiment, by forming the first adhesive layer 14 using a hard adhesive (relatively hard adhesive) in which a shear storage modulus at 25° C. is from $5.0 \times 10^4$ Pa to $1.0 \times 10^6$ Pa and a compressive stress measured at a test speed of 0.5 mm/min and a compressive strain of 40% is from 500 kPa to 1200 kPa, the impact resistance of the foldable display 1 can be further improved.

The flexible display layer 5 includes, for example, a flexible substrate, a thin film transistor layer, and a display layer provided with multiple pixels each including multiple subpixels. The display layer may be, for example, a liquid crystal display layer or a display layer in which a light-emitting element is provided for each of the multiple subpixels. When the display layer is a display layer in which a light-emitting element is provided for each of the multiple subpixels, the light-emitting element may include a light-emitting layer containing quantum dots or an organic light-emitting layer. Note that the flexible display layer 5 is preferably formed with a thickness of, for example, 10 μm or more and less than 100 μm, but is not limited thereto.

As illustrated in FIG. 6, the function layer 6 provided on the flexible display layer 5 includes a fourth adhesive layer 9, a touch panel 10, a fifth adhesive layer 11, a polarizer 12, and a sixth adhesive layer 13 in this order from the flexible display layer 5 side.

The fourth adhesive layer 9 is preferably formed with a thickness of 15 μm to 50 μm. The touch panel 10 is preferably formed with a thickness of 30 μm to 50 μm. The fifth adhesive layer 11 is preferably formed with a thickness of 15 μm to 50 μm. The polarizer 12 is preferably formed with a thickness of 30 μm to 50 μm. The sixth adhesive layer 13 is preferably formed with a thickness of 15 μm to 50 μm. Note that the fourth adhesive layer 9, the fifth adhesive layer 11, and the sixth adhesive layer 13 may be formed using any type of adhesive. For example, the above-described soft adhesive (relatively soft adhesive) or the above-described hard adhesive (relatively hard adhesive) may be used.

As illustrated in FIG. 6, the flexible cover 7 is provided on the function layer 6. An example of the flexible cover 7 is a known window film treated with a hard coat. The flexible cover 7 is preferably formed with a thickness of 50 μm to 100 μm.

FIG. 7 is a cross-sectional view illustrating a schematic configuration of a foldable display 1$a$ according to a modification of the first embodiment in a non-bent state (open state).

As illustrated in FIG. 7, a housing unit 2' included in the foldable display 1$a$ includes hinge members 2$h$1, 2$h$2', and 2$h$3. A recessed portion 2$d$3, which is a step portion, is provided in part of the hinge member 2$h$2'. Therefore, the housing unit 2' included in the foldable display 1$a$ is different from the above-described foldable display 1 in that the housing unit 2' further includes the recessed portion 2$d$3, which is a step portion, in addition to the step portions 2$d$1 and 2$d$2.

An adhesive may be formed in the recessed portion 2$d$3, which is a step portion. In this case, part of a third portion BR of a support substrate 3*a* may be fixed to the hinge member 2*h*2' with the adhesive. Regarding a type of the adhesive to be used and a method of forming the adhesive, for example, the type of adhesive and the method for forming the adhesive described in International Patent Publication "WO 2020/065936 A1" may be used.

Note that in the present embodiment, the case in which the recessed portion 2*d*3 is provided as the step portion in part of the hinge member 2*h*2' is described as an example, but the step portion is not limited to the recessed portion. Although not illustrated, a protruding portion may be provided as a step portion in part of each of the hinge members 2*h*1, 2*h*2', and 2*h*3. Examples of the protruding portion include members such as screws provided in the hinge members 2*h*1, 2*h*2', and 2*h*3.

As illustrated in FIG. 7, the third portion BR of the support substrate 3*a* includes, in the above-described first state, a first region (e.g., including a region B and a region C indicated by dotted lines in FIG. 7) overlapping the step portions 2*d*1 and 2*d*2 and the recessed portion 2*d*3, and a second region (e.g., including a region A indicated by a dotted line in FIG. 7) overlapping a planar portion 2P. That is, the first region of the third portion BR of the support substrate 3*a* is a region obtained by combining a region of the third portion BR of the support substrate 3*a* overlapping the step portion 2*d*1, a region of the third portion BR of the support substrate 3*a* overlapping the step portion 2*d*2, and a region of the third portion BR of the support substrate 3*a* overlapping the recessed portion 2*d*3, and the second region of the third portion BR of the support substrate 3*a* is a region of the third portion BR of the support substrate 3*a* overlapping the planar portion 2P.

As illustrated in FIG. 7, a first ratio of volume of openings 3*d* of an opening group in the first region to volume of the first region in the first region of the support substrate 3*a* is lower than a second ratio of volume of the openings 3*d* of an opening group in the second region to volume of the second region in the second region of the support substrate 3*a*.

Figure 8:
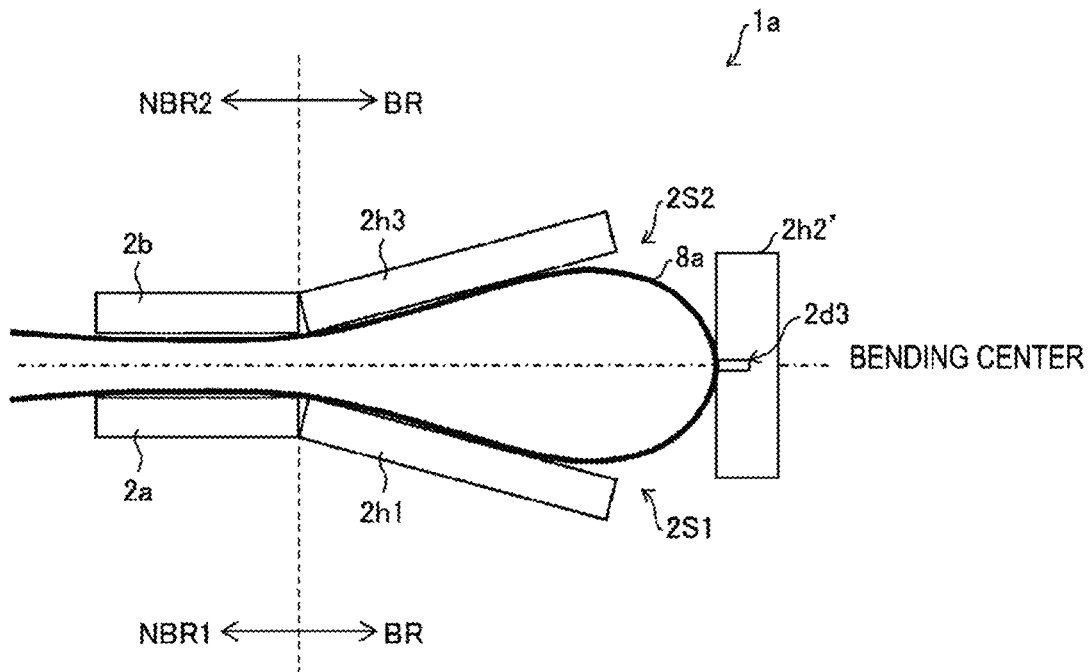
FIG. 8 is a diagram illustrating the foldable display according to the modification of the first embodiment in a bent state (folded state).

FIG. 8 is a diagram illustrating the foldable display 1*a* according to the modification of the first embodiment in a bent state (folded state).

As illustrated in FIG. 8, in the folded state of the foldable display 1*a* with a surface of the first housing 2*a* on a support substrate 3*a* side and a surface of the second housing 2*b* on the support substrate 3*a* side placed so as to face each other and a distance between the first housing 2*a* and the second housing 2*b* being reduced, that is, in a second state in which a flexible display panel 8*a* is in the bent state, the flexible display panel 8*a* has a droplet shape.

As illustrated in FIG. 8, the recessed portion 2*d*3 is preferably provided along a bending center of the flexible display panel 8*a*.

FIG. 9 is a diagram showing evaluation results of impact resistance of the foldable display 1 according to the first embodiment and the foldable display 1*a* according to the modification of the first embodiment.

The evaluation results of impact resistance shown in FIG. 9 are results of various evaluations of the foldable display 1 and the foldable display 1*a* in the first state described above.

In a ball drop evaluation, results of dropping a predetermined steel ball (weight 24 g, diameter 18 mm) onto the flexible cover 7 from a predetermined height are shown, in a pen drop evaluation, results of dropping a predetermined pen (weight 19 g, a pen tip made of elastomer) onto the flexible cover 7 from a predetermined height, and in a step feeling (pen tracing) evaluation, the pen tip was manually slid against the flexible cover 7 while applying force to check the feeling.

A material occupancy rate of the support substrate shown in FIG. 9 means a ratio of the volume of the material of the support substrate 3 in a corresponding region to the volume of the corresponding region (a material occupancy rate in the support substrate 3), and (100%–the material occupancy rate in the support substrate 3) is a ratio of the volume of the openings 3*d* in the support substrate 3 in the corresponding region to the volume of the corresponding region.

A height shown in FIG. 9 means the maximum height at which defects such as bright spots or bright lines do not occur when the drop ball evaluation is conducted in 5 cm increments in the foldable displays 1 and 1*a* after the above-described evaluations. In addition, a symbol (*) shown in FIG. 9 means an upper limit height in the evaluation conducted at the time without any defects such as bright spots or bright lines. Although this upper limit height is determined for the purpose of protecting the housing unit, in reality, the defects may not occur even when the ball is dropped from an even higher position.

In the ball drop evaluation, when the ball is dropped at positions of the step portions 2*d*1, 2*d*2, and 2*d*3, it can be confirmed that the impact resistance is improved by 5 cm in the case in which the material occupancy rate of the support substrate 3 is from 40% to 50% (the occupancy rate of the openings 3*d* in the support substrate 3 is from 50% to 60%) compared to the case in which the material occupancy rate of the support substrate 3 is from 30% to 35% (the occupancy rate of the openings 3*d* in the support substrate 3 is from 65% to 70%). When the ball is dropped at edge positions of the step portions 2*d*1, 2*d*2, and 2*d*3, it can be confirmed that the impact resistance is also improved by 5 cm in the case in which the material occupancy rate of the support substrate 3 is from 40% to 50% (the occupancy rate of the openings 3*d* in the support substrate 3 is from 50% to 60%) and the material occupancy rate of the support substrate 3 is from 50% to 65% (the occupancy rate of the openings 3*d* in the support substrate 3 is from 35% to 50%) compared to the case in which the material occupancy rate of the support substrate 3 is from 30% to 35% (the occupancy rate of the openings 3*d* in the support substrate 3 is from 65% to 70%). Further, it can be confirmed that in the case in which the material occupancy rate of the support substrate 3 is from 70% to 80% (the occupancy rate of the openings 3*d* in the support substrate 3 is from 20% to 30%), the impact resistance is improved by 10 cm compared to the case in which the material occupancy rate of the support substrate 3 is from 30% to 35% (the occupancy rate of the openings 3*d* in the support substrate 3 is from 65% to 70%). As described above, it is preferable that the material occupancy rate of the support substrate 3 be 40% or more (the occupancy rate of the openings 3*d* in the support substrate 3 be 60% or less) also in the regions overlapping the edges of the step portions 2*d*1, 2*d*2, and 2*d*3. Note that since the planar portion of the hinge member 2*h*2', the planar portions of the hinge members 2*h*1, 2*h*2, and 2*h*3, and the first housing 2*a* and the second housing 2*b*, which are non-bent portions, originally have high impact resistance, even when the material occupancy rate of the support substrate 3 (the occupancy rate of the openings 3*d* in the support substrate 3) was changed, no effect of improving the impact resistance was able to be obtained.

In the pen drop evaluation, when the pen was dropped at the positions of the step portions 2*d*1, 2*d*2, and 2*d*3 and when the pen was dropped at the edge positions of the step portions 2*d*1, 2*d*2, and 2*d*3, in the case in which the material occupancy rate of the support substrate 3 was 40% or more (the occupancy rate of the openings 3*d* in the support substrate 3 was 60% or less), an effect of improving the impact resistance was obtained. In the case that the material occupancy rate of the support substrate 3 was 50% or more, the impact resistance effect was further increased. Note that since the planar portion of the hinge member 2*h*2', the planar portions of the hinge members 2*h*1, 2*h*2, and 2*h*3, and the first housing 2*a* and the second housing 2*b*, which are non-bent portions, originally have high impact resistance, even when the material occupancy rate of the support substrate 3 (the occupancy rate of the openings 3*d* in the support substrate 3) was changed, no effect of improving impact resistance was able to be obtained.

The step feeling (pen tracing) evaluation was conducted only for the positions of the step portions 2*d*1, 2*d*2, and 2*d*3. It can be confirmed that in the case in which the material occupancy rate of the support substrate 3 is from 40% to 50% (the occupancy rate of the openings 3*d* in the support substrate 3 is from 50% to 60%), the step feeling is greatly reduced compared to the case in which the material occupancy rate of the support substrate 3 is from 30% to 35% (the occupancy rate of the openings 3*d* in the support substrate 3 is from 65% to 70%), and in the case in which the material occupancy rate of the support substrate 3 is 50% or more (the occupancy rate of the openings 3*d* in the support substrate 3 is 50% or less), the step feeling is almost eliminated.

FIG. 10 is a diagram showing evaluation results of a bending test comparing a case in which the first film layer 15 is a plastic film and a case in which the first film layer 15 is a metal film, where the first film layer 15 is in the cushion layer 4 included in the foldable display 1 according to the first embodiment and the foldable display 1*a* according to the modification of the first embodiment.

Results of checking peeling or the like in each layer of the foldable displays 1 and 1*a* in the bending test are shown in FIG. 10 by the number of times the foldable displays 1 and 1*a* changed from the above-described first state, through the above-described second state, and then back to the above-described first state. Note that the results of the bending test shown in FIG. 10 are results of a bending test conducted at a speed of 7 rpm.

As shown in FIG. 10, when the first film layer 15 of the cushion layer 4 is a metal film, satisfactory bending durability cannot be obtained. However, when the first film layer 15 of the cushion layer 4 is a plastic film such as PET as in the present embodiment, it is possible to obtain the foldable displays 1 and 1*a* having satisfactory bending durability. In addition, a symbol (*) shown in FIG. 10 means an upper limit of number of times in the evaluation conducted this time without any defects such as peeling. Therefore, in reality, even when the number of times exceeds the above upper limit, the defects may not occur. NG in FIG. 10 means that the peeling occurred at that number of times, while OK means that the peeling did not occur at that number of times.

FIG. 11 is a diagram showing evaluation results of impact resistance comparing a case in which the first adhesive layer 14 is a hard adhesive and a case in which the first adhesive layer 14 is a soft adhesive, where the first adhesive layer 14 is in the cushion layer 4 included in the foldable display 1 according to the first embodiment and the foldable display 1*a* according to the modification of the first embodiment.

As shown in FIG. 11, in the pen drop evaluation, when the pen was dropped at the positions of the step portions 2*d*1, 2*d*2, and 2*d*3, and when the pen was dropped at the edge positions of the step portions 2*d*1, 2*d*2, and 2*d*3, in both cases of using the hard adhesive and the soft adhesive as the first adhesive layer 14 of the cushion layer 4, an effect of improving the impact resistance was obtained in the case in which the material occupancy rate of the support substrate 3 was 50% or more (the occupancy rate of the openings 3*d* in the support substrate 3 was 50% or less) compared to the case in which the material occupancy rate of the support substrate 3 was from 30% to 35% (the occupancy rate of the openings 3*d* in the support substrate 3 was from 65% to 70%). In particular, when a hard adhesive was used as the first adhesive layer 14 of the cushion layer 4, an effect of largely improving the impact resistance was obtained when the pen was dropped at the edge positions of the step portions 2*d*1, 2*d*2, and 2*d*3.

As described above, in the foldable display 1 according to the first embodiment and the foldable display 1*a* according to the modification of the first embodiment, the cases in which the housing units 2 and 2' include the first housing 2*a* and the second housing 2*b*, and the housing unit 2 includes the hinge members 2*h*1, 2*h*2, and 2*h*3 coupling the first housing 2*a* and the second housing 2*b*, and the housing unit 2' includes the hinge members 2*h*1, 2*h*2', and 2*h*3 coupling the first housing 2*a* and the second housing 2*b*, are described as examples, but the housings and the hinge members are not limited thereto. For example, the housing unit may further include a third housing, and another hinge member that couples one of the first housing 2*a* and the second housing 2*b* to the third housing. Further, the housing unit may include N (N is a natural number equal to or greater than 4) housings and N−1 hinge members. Thus, by applying the above-described support substrate 3 or 3*a* to a foldable display including the multiple bending regions, it is possible to achieve a foldable display having excellent flexibility while improving impact resistance compared to foldable displays in the related art.

Second Embodiment

Next, with reference to FIG. 12, a second embodiment of the disclosure will be described. A foldable display in the present embodiment is different from the foldable displays 1 and 1*a* described in the first embodiment in that part of a second region in contact with a first region of a support substrate is divided into multiple regions. The others are as described in the first embodiment. For convenience of description, members having the same functions as those illustrated in diagrams of the first embodiment are denoted by the same reference signs, and descriptions thereof are omitted.

Figure 12:
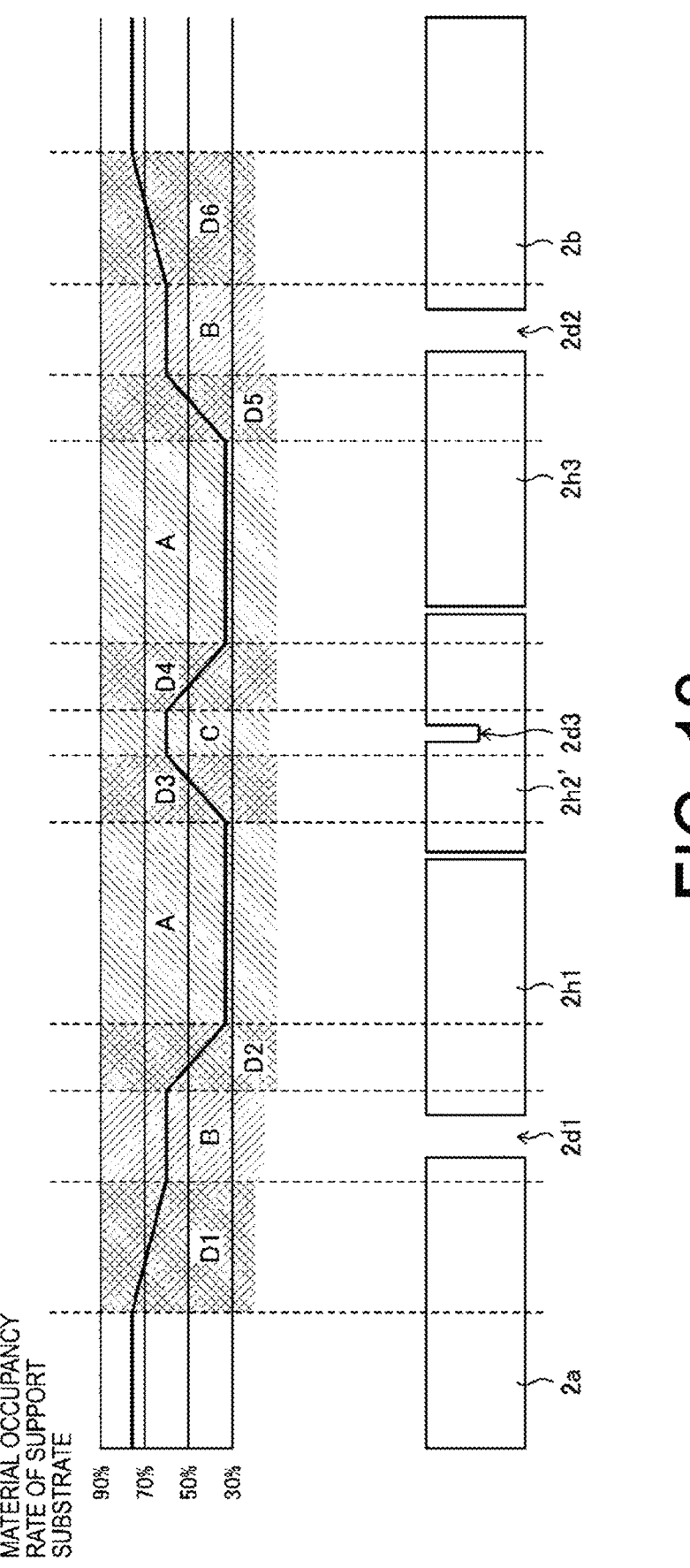
FIG. 12 is a diagram illustrating one example of an opening pattern provided in a support substrate included in a foldable display according to a second embodiment.

FIG. 12 is a diagram illustrating an example of an opening pattern provided in the support substrate included in the foldable display according to the second embodiment.

As illustrated in FIG. 12, a third portion BR of the support substrate includes, in the above-described first state, a first region (e.g., including a region B and a region C in FIG. 12) overlapping step portions 2*d*1 and 2*d*2 and a recessed portion 2*d*3, and a second region (e.g., including a region A and regions D2 to D5 in FIG. 12) overlapping a planar portion 2P.

In the present embodiment, a region in which a material occupancy rate of the support substrate is 40% or more (an occupancy rate of openings in the support substrate is 60% or less) is formed not only in the first region overlapping the step portions 2*d*1 and 2*d*2 and the recessed portion 2*d*3, but also in regions overlapping edges of the step portions 2*d*1 and 2*d*2 and edges of the recessed portion 2*d*3. Therefore, a part of the second region overlapping the planar portion 2P is a region in which the material occupancy rate of the support substrate is 40% or more (the occupancy rate of the openings in the support substrate is 60% or less), and a remaining part of the second region overlapping the planar portion 2P is a region in which the material occupancy rate of the support substrate is less than 40% (the occupancy rate of the openings in the support substrate is more than 60%). With such a configuration, as described above in the first embodiment, it is possible to achieve a foldable display having even higher impact resistance.

In the present embodiment, as described above, an example is described in which the region in which the material occupancy rate of the support substrate is 40% or more (the occupancy rate of the openings in the support substrate is 60% or less) is formed not only in the first region overlapping the step portions 2d1 and 2d2 and the recessed portion 2d3, but also in the regions overlapping the edges of the step portions 2d1 and 2d2 and the edges of the recessed portion 2d3, but this case is just an example. Regions in which the material occupancy rate of the support substrate is 40% or more (the occupancy rate of the openings in the support substrate is 60% or less) may be formed only in the regions overlapping the edges of the step portions 2d1 and 2d2 or the regions overlapping the edges of the recessed portion 2d3.

As illustrated in FIG. 12, part of the second region in contact with the first region of the support substrate is divided into multiple regions, in each of the multiple regions, a ratio of the volume of openings of an opening group in each region to the volume of each region is not constant, and in each of the multiple regions, as a distance from the first region increases, the material occupancy rate of the support substrate in each of the multiple regions decreases (the occupancy rate of the openings in the support substrate in each of the multiple regions increases) in a range where the material occupancy rate of the support substrate is from 40% or more to less than 40% (the occupancy rate of the openings in the support substrate is from 60% or less to more than 60%). According to such a configuration, undulations to be generated in the support substrate can be reduced.

Part of a region that is in contact with the first region and includes one end portion of the support substrate fixed to a first housing 2a, that is, a region D1 illustrated in FIG. 12, is divided into multiple regions, in each of the multiple regions, a ratio of the volume of the openings of the opening group in each region to the volume of each region is not constant, and in each of the multiple regions, a material occupancy rate of the support substrate in each of the multiple regions increases (an occupancy rate of the openings in the support substrate in each of the multiple regions decreases) as a distance from the first region increases. According to such a configuration, undulations to be generated in the support substrate can be further reduced.

Part of a region that is in contact with the first region and includes another end portion of the support substrate fixed to a second housing 2b, that is, a region D6 illustrated in FIG. 12, is divided into multiple regions, in each of the multiple regions, a ratio of the volume of the openings of the opening group in each region to the volume of each region is not constant, and in each of the multiple regions, a material occupancy rate of the support substrate in each of the multiple regions increases (an occupancy rate of the openings in the support substrate in each of the multiple regions decreases) as a distance from the first region increases.

According to such a configuration, undulations to be generated in the support substrate can be further reduced.

Note that in the present embodiment, the case in which the material occupancy rate of the support substrate in each of the multiple regions continuously decreases or increases is described as an example, but this case is just an example, and the material occupancy rate of the support substrate in each of the multiple regions may be decreased or increased in steps. Continuously changing the material occupancy rate of the support substrate in each of the multiple regions can be achieved by continuously increasing or decreasing the width WB of the opening 3d in the Y direction Y (see (a) of FIG. 4).

Third Embodiment

Next, a third embodiment of the disclosure will be described with reference to FIG. 13 and FIG. 14. A foldable display 1b according to the present embodiment is different from the foldable displays 1 and 1a described in the first and second embodiments in that a flexible display panel 8b is U-shaped when the foldable display 1b is bent (folded). The others are as described in the first and second embodiments. For convenience of description, members having the same functions as the members illustrated in the diagrams in the first and second embodiments are denoted by the same reference signs, and descriptions thereof will be omitted.

Figure 13:
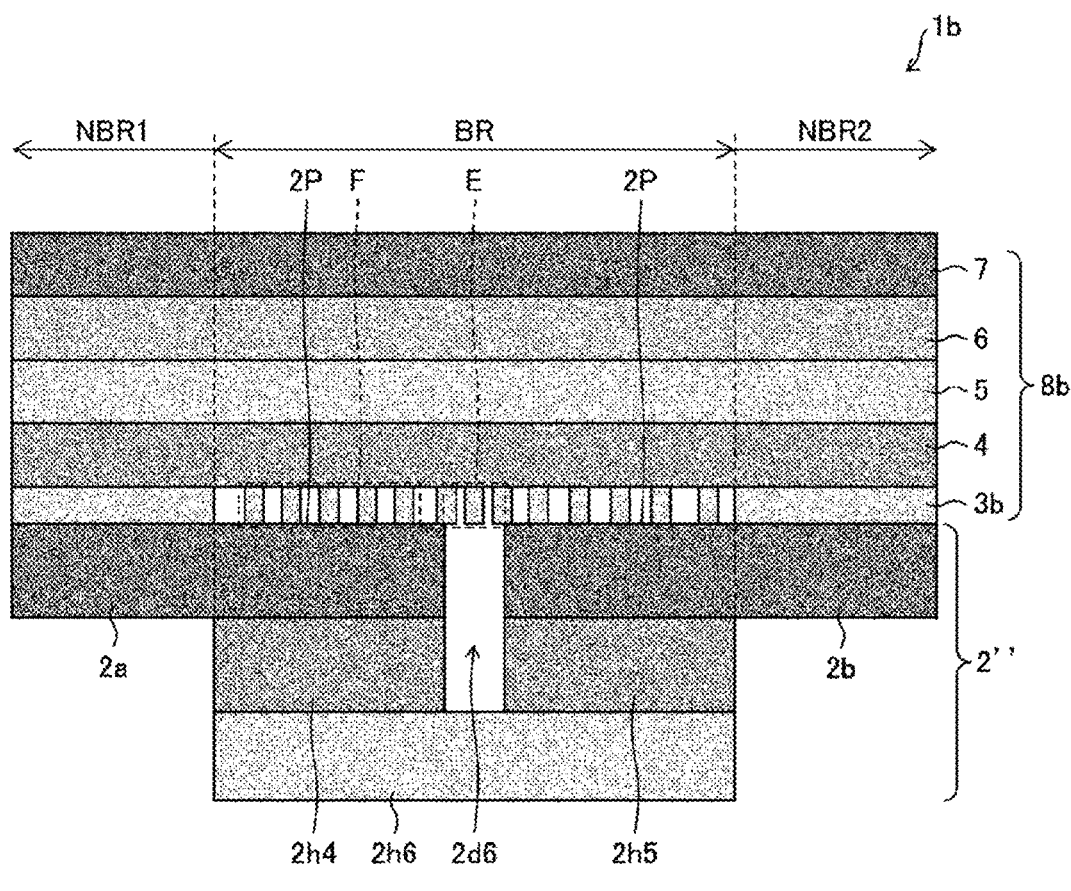
FIG. 13 is a cross-sectional view illustrating a schematic configuration of a foldable display according to a third embodiment in a non-bent state (open state).

FIG. 13 is a cross-sectional view illustrating a schematic configuration of the foldable display 1b according to the third embodiment in a non-bent state (open state).

As illustrated in FIG. 13, a region NBR1 including one end portion of a support substrate 3b, which is an example of a first portion of the support substrate 3b, is fixed to a region including one end portion of a first housing 2a of a housing unit 2", a region NBR2 including another end portion of the support substrate 3b, which is an example of a second portion of the support substrate 3b, is fixed to a region including one end portion of a second housing 2b of the housing unit 2", whereby a flexible display panel 8b is fixed to the housing unit 2". A planar portion 2P of the housing unit 2" is formed by part of the first housing 2a other than the region including the one end portion, and part of the second housing 2b other than the region including the one end portion. A step portion 2d6 includes a gap between the first housing 2a and the second housing 2b.

As illustrated in FIG. 13, a third portion BR of the support substrate 3b includes, in the first state described above, a first region overlapping the step portion 2d6 (e.g., including a region E indicated by a dotted line in FIG. 13) and a second region overlapping the planar portion 2P (e.g., including a region F indicated by a dotted line in FIG. 13).

As illustrated in FIG. 13, a first ratio of volume of openings 3d of an opening group in the first region to volume of the first region in the first region of the support substrate 3b is lower than a second ratio of volume of openings 3d of an opening group in the second region to volume of the second region in the second region of the support substrate 3b.

The foldable display 1b can provide satisfactory impact resistance and flexibility.

Figure 14:
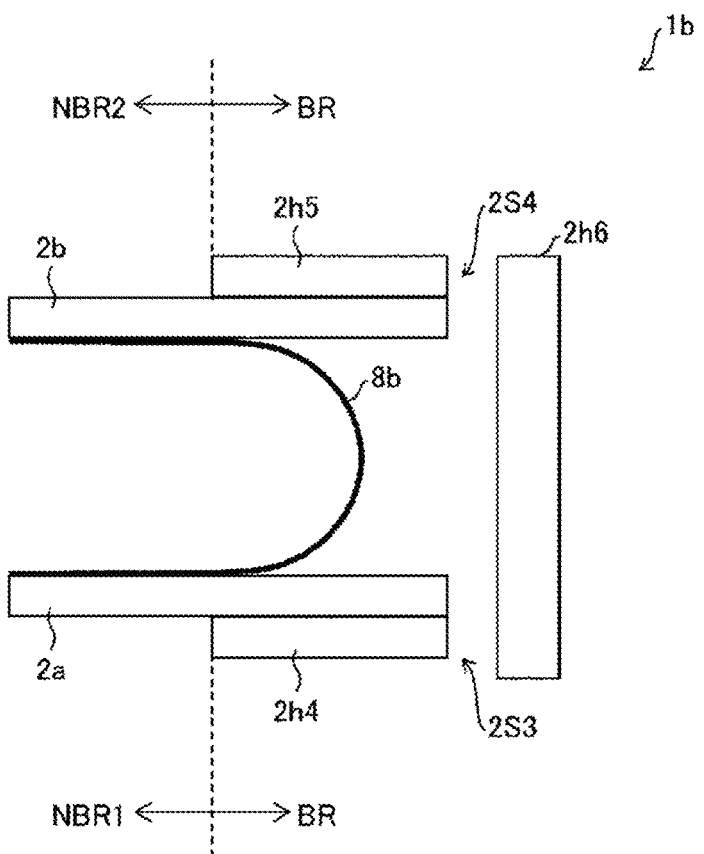
FIG. 14 is a diagram illustrating the foldable display according to the third embodiment in a bent state (folded state).

FIG. 14 is a diagram illustrating the foldable display 1b according to the third embodiment in a bent state (folded state).

As illustrated in FIG. 14, in the folded state of the foldable display 1b with a surface of the first housing 2a on a support substrate 3b side and a surface of the second housing 2b on the support substrate 3b side placed to face each other and a distance between the first housing 2*a* and the second housing 2*b* being reduced, that is, in a second state in which the flexible display panel 8*b* is in the bent state, the flexible display panel 8*b* has a U shape.

As described above, in the foldable display 1*b* according to the third embodiment, the case in which the housing unit 2" includes the first housing 2*a*, the second housing 2*b*, and hinge members 2*h*4, 2*h*5, and 2*h*6 coupling the first housing 2*a* and the second housing 2*b* is described as an example, but the housings and the hinge members are not limited thereto. For example, the housing unit may further include a third housing, and another hinge member that couples one of the first housing 2*a* and the second housing 2*b* to the third housing. Further, the housing unit may include N (N is a natural number equal to or greater than 4) housings and N−1 hinge members. Thus, by applying the above-described support substrate 3*b* to a foldable display including the multiple bending regions, it is possible to achieve a foldable display having excellent flexibility while improving impact resistance compared to foldable displays in the related art.

Supplement

First Aspect

A foldable display including a housing unit including a hinge member, and a first housing and a second housing coupled via the hinge member, and a flexible display panel including a flexible display layer and a support substrate, in which the support substrate is provided between the flexible display layer and the housing unit, by fixing a first portion of the support substrate to the first housing and fixing a second portion of the support substrate to the second housing, the flexible display panel is fixed to the housing unit, in a first state in which a surface of the first housing on a support substrate side and a surface of the second housing on the support substrate side are aligned on the same plane and the flexible display panel is in a non-bent state, the housing unit includes a planar portion being flat with respect to the same plane and at least one step portion including a step with respect to the same plane, the support substrate includes a third portion between the first portion and the second portion of the support substrate, the third portion of the support substrate includes, in the first state, a first region overlapping the at least one step portion and a second region overlapping the planar portion, and a first ratio of volume of openings of an opening group in the first region to volume of the first region in the first region of the support substrate is lower than a second ratio of volume of openings of an opening group in the second region to volume of the second region in the second region of the support substrate.

Second Aspect

The foldable display according to the first aspect, in which the openings of the opening groups are openings passing through from a surface of the support substrate on a flexible display layer side to a surface of the support substrate on a housing unit side.

Third Aspect

The foldable display according to the first or second aspect, in which the first ratio is 60% or less.

Fourth Aspect

The foldable display according to the first or second aspect, in which the second ratio is from 55% to 75%.

Fifth Aspect

The foldable display according to any one of the first to fourth aspects, in which part of the second region in contact with the first region is divided into multiple regions, in each of the multiple regions, a ratio of volume of openings of an opening group of each of the multiple regions to volume of each of the multiple regions is not constant, and in each of the multiple regions, as a distance from the first region increases, the ratio of each of the multiple regions increases in a range of the first ratio or more to the second ratio or less.

Sixth Aspect

The foldable display according to any one of the first to fifth aspects, in which part of the first portion of the support substrate being in contact with the first region and fixed to the first housing is divided into multiple regions, in each of the multiple regions, a ratio of volume of openings of an opening group of each of the multiple regions to volume of each of the multiple regions is not constant, and in each of the multiple regions, as a distance from the first region increases, the ratio of each of the multiple regions decreases.

Seventh Aspect

The foldable display according to any one of the first to sixth aspects, in which part of the second portion of the support substrate being in contact with the first region and fixed to the second housing is divided into multiple regions, in each of the multiple regions, a ratio of volume of openings of an opening group of each of the multiple regions to volume of each of the multiple regions is not constant, and in each of the multiple regions, as a distance from the first region increases, the ratio of each of the multiple regions decreases.

Eighth Aspect

The foldable display according to any one of the first to seventh aspects, in which the planar portion is formed by the hinge member, the at least one step portion includes multiple step portions, and the multiple step portions include a gap between the first housing and the hinge member and a gap between the second housing and the hinge member.

Ninth Aspect

The foldable display according to the eighth aspect, in which the multiple step portions further include a recessed portion provided in part of the hinge member.

Tenth Aspect

The foldable display according to the ninth aspect, in which an adhesive is formed in the recessed portion, and part of the third portion of the support substrate is fixed to the hinge member by the adhesive.

Eleventh Aspect

The foldable display according to the ninth or tenth aspect, in which the recessed portion is provided along a bending center of the flexible display panel.

Twelfth Aspect

The foldable display according to any one of the eighth to eleventh aspects, in which the multiple step portions further include a protruding portion provided in part of the hinge member.

Thirteenth Aspect

The foldable display according to any one of the eighth to twelfth aspects, in which the housing unit includes the first housing, the second housing, and the hinge member configured to couple the first housing and the second housing, and in a second state in which the surface of the first housing on the support substrate side and the surface of the second housing on the support substrate side face each other and the flexible display panel is in a bent state, the flexible display panel has a droplet shape.

Fourteenth Aspect

The foldable display according to any one of the first to seventh aspects, in which the planar portion is formed by part other than part to which the first portion of the support substrate is fixed in the first housing and part other than part to which the second portion of the support substrate is fixed in the second housing, and the at least one step portion includes a gap between the first housing and the second housing.

Fifteenth Aspect

The foldable display according to any one of the first to seventh aspects, in which the housing unit includes the first housing, the second housing, and the hinge member configured to couple the first housing and the second housing, by fixing a region including one end portion of the support substrate to a region including one end portion of the first housing and fixing a region including another end portion of the support substrate to a region including one end portion of the second housing, the flexible display panel is fixed to the housing unit, the planar portion is formed by part of the first housing other than the region including the one end portion and part of the second housing other than the region including the one end portion, the at least one step portion includes a gap between the first housing and the second housing, and in a second state in which the surface of the first housing on the support substrate side and the surface of the second housing on the support substrate side face each other and the flexible display panel is in a bent state, the flexible display panel has a U shape.

Sixteenth Aspect

The foldable display according to any one of the first to fifteenth aspects, in which the support substrate is a metal substrate or a resin substrate.

Seventeenth Aspect

The foldable display according to any one of the first to sixteenth aspects, in which a thickness of the support substrate is from 100 μm to 300 μm.

Eighteenth Aspect

The foldable display according to any one of the first to seventeenth aspects, in which the flexible display panel further includes a cushion layer including at least one resin layer between the flexible display layer and the support substrate.

Nineteenth Aspect

The foldable display according to the eighteenth aspect, in which the cushion layer includes a first adhesive layer, a first film layer, a second adhesive layer, a second film layer, and a third adhesive layer in this order from the support substrate side, each of the first film layer and the second film layer is a resin layer, and an elastic modulus of the first film layer is higher than an elastic modulus of the second film layer.

Twentieth Aspect

The foldable display according to the eighteenth or nineteenth aspect, in which the cushion layer includes a first adhesive layer, a first film layer, a second adhesive layer, a second film layer, and a third adhesive layer in this order from a support substrate side, the first adhesive layer has a shear storage modulus of $5.0 \times 10^4$ Pa or more and $1.0 \times 10^6$ Pa or less at 25° C., and a compressive stress of 500 kPa or more and 1200 kPa or less, measured at a test speed of 0.5 mm/min and a compressive strain of 40%.

Twenty-First Aspect

The foldable display according to any one of the first to twentieth aspects, in which the flexible display layer includes a light-emitting layer containing quantum dots or an organic light-emitting layer.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be used for foldable displays.

The invention claimed is:

1. A foldable display comprising: a housing unit including a hinge member, and a first housing and a second housing coupled via the hinge member; and
   a flexible display panel including a flexible display layer and a support substrate, wherein the support substrate is provided between the flexible display layer and the housing unit,
   by fixing a first portion of the support substrate to the first housing and fixing a second portion of the support substrate to the second housing, the flexible display panel is fixed to the housing unit,
   in a first state in which a surface of the first housing on a support substrate side and a surface of the second housing on the support substrate side are aligned on a same plane and the flexible display panel is in a non-bent state, the housing unit includes a planar portion being flat with respect to the same plane and at least one step portion including a step with respect to the same plane,
   the support substrate includes a third portion between the first portion and the second portion of the support substrate,
   the third portion of the support substrate includes, in the first state, a first region overlapping the at least one step portion and a second region overlapping the planar portion, and
   a first ratio of volume of openings of an opening group in the first region to volume of the first region in the first region of the support substrate is lower than a second ratio of volume of openings of an opening group in the second region to volume of the second region in the second region of the support substrate.

2. The foldable display according to claim 1, wherein the openings of the opening groups are openings passing through from a surface of the support substrate on a flexible display layer side to a surface of the support substrate on a housing unit side.

3. The foldable display according to claim 1, wherein the first ratio is 60% or less.

4. The foldable display according to claim 1, wherein the second ratio is from 55% to 75%.

5. The foldable display according to claim 1, wherein part of the second region in contact with the first region is divided into multiple regions,
   in each of the multiple regions, a ratio of volume of openings of an opening group of each of the multiple regions to volume of each of the multiple regions is not constant, and
   in each of the multiple regions, as a distance from the first region increases, the ratio of each of the multiple regions increases in a range of the first ratio or more to the second ratio or less.

6. The foldable display according to claim 1, wherein part of the first portion of the support substrate being in contact with the first region and fixed to the first housing is divided into multiple regions,

21 in each of the multiple regions, a ratio of volume of openings of an opening group of each of the multiple regions to volume of each of the multiple regions is not constant, and in each of the multiple regions, as a distance from the first region increases, the ratio of each of the multiple regions decreases.

7. The foldable display according to claim 1, wherein part of the second portion of the support substrate being in contact with the first region and fixed to the second housing is divided into multiple regions, in each of the multiple regions, a ratio of volume of openings of an opening group of each of the multiple regions to volume of each of the multiple regions is not constant, and in each of the multiple regions, as a distance from the first region increases, the ratio of each of the multiple regions decreases.

8. The foldable display according to claim 1, wherein the planar portion is formed by the hinge member, the at least one step portion includes multiple step portions, and the multiple step portions include a gap between the first housing and the hinge member and a gap between the second housing and the hinge member.

9. The foldable display according to claim 8, wherein the multiple step portions further include a recessed portion provided in part of the hinge member.

10. The foldable display according to claim 9, wherein an adhesive is formed in the recessed portion, and part of the third portion of the support substrate is fixed to the hinge member by the adhesive.

11. The foldable display according to claim 9, wherein the recessed portion is provided along a bending center of the flexible display panel.

12. The foldable display according to claim 8, wherein the multiple step portions further include a protruding portion provided in part of the hinge member.

13. The foldable display according to claim 8, wherein the housing unit includes the first housing, the second housing, and the hinge member configured to couple the first housing and the second housing, and in a second state in which the surface of the first housing on the support substrate side and the surface of the second housing on the support substrate side face each other and the flexible display panel is in a bent state, the flexible display panel has a droplet shape.

14. The foldable display according to claim 1, wherein the planar portion is formed by part other than part to which the first portion of the support substrate is fixed in the first housing and part other than part to which the second portion of the support substrate is fixed in the second housing, and the at least one step portion includes a gap between the first housing and the second housing.

15. The foldable display according to claim 1, wherein the housing unit includes the first housing, the second housing, and the hinge member configured to couple the first housing and the second housing, by fixing a region including one end portion of the support substrate to a region including one end portion of the first housing and fixing a region including another end portion of the support substrate to a region including one end portion of the second housing, the flexible display panel is fixed to the housing unit, the planar portion is formed by part of the first housing other than the region including the one end portion and part of the second housing other than the region including the one end portion, the at least one step portion includes a gap between the first housing and the second housing, and in a second state in which the surface of the first housing on the support substrate side and the surface of the second housing on the support substrate side face each other and the flexible display panel is in a bent state, the flexible display panel has a U shape.

16. The foldable display according to claim 1, wherein the support substrate is a metal substrate or a resin substrate.

17. The foldable display according to claim 1, wherein a thickness of the support substrate is from 100 μm to 300 μm.

18. The foldable display according to claim 1, wherein the flexible display panel further includes a cushion layer including at least one resin layer between the flexible display layer and the support substrate.

19. The foldable display according to claim 18, wherein the cushion layer includes a first adhesive layer, a first film layer, a second adhesive layer, a second film layer, and a third adhesive layer in this order from the support substrate side, each of the first film layer and the second film layer is a resin layer, and an elastic modulus of the first film layer is higher than an elastic modulus of the second film layer.

20. The foldable display according to claim 1, wherein the flexible display layer includes a light-emitting layer containing quantum dots or an organic light-emitting layer.

\* \* \* \* \*